United States Patent
Kawai

[11] Patent Number: 5,811,913
[45] Date of Patent: Sep. 22, 1998

[54] PIEZOELECTRIC TRANSFORMER HAVING FOUR-TERMINAL STRUCTURE

[75] Inventor: Hidemasa Kawai, Tokyo, Japan

[73] Assignee: NEC Corporation, Tokyo, Japan

[21] Appl. No.: 668,963

[22] Filed: Jun. 18, 1996

[30] Foreign Application Priority Data

Jun. 22, 1995 [JP] Japan .................................. 7-155812

[51] Int. Cl.⁶ .................................................. H01L 41/08
[52] U.S. Cl. ............................................ 310/359; 310/366
[58] Field of Search ...................................... 310/359, 366

[56] References Cited

U.S. PATENT DOCUMENTS

| | | | |
|---|---|---|---|
| 2,830,274 | 4/1958 | Rosen et al. | 332/32 |
| 2,974,296 | 3/1961 | Rosen | 310/359 |
| 3,549,913 | 12/1970 | Moriki et al. | 310/359 |
| 3,598,909 | 8/1971 | Sasaki et al. | 310/359 |
| 3,736,446 | 5/1973 | Berlincourt et al. | 310/359 |
| 5,365,141 | 11/1994 | Kawai et al. | 310/359 |

FOREIGN PATENT DOCUMENTS

| | | | |
|---|---|---|---|
| 0 605 901 A1 | 7/1994 | European Pat. Off. | 310/359 |
| 61-54685 | 3/1986 | Japan | H01L 41/08 |
| 61-54686 | 3/1986 | Japan | H01L 41/08 |
| 61-152165 | 7/1986 | Japan | H04N 3/185 |
| 6-177451 | 6/1994 | Japan | H01L 41/107 |
| 738014 | 5/1980 | U.S.S.R. | 310/318 |

*Primary Examiner*—Thomas M. Dougherty
*Attorney, Agent, or Firm*—Young & Thompson

[57] ABSTRACT

In a piezoelectric transformer, a piezoelectrically inactive region 11 is provided between a driving portion 22 and a power generating portion 31. The power generating portion 31 extends longitudinally of the piezoelectric body 1 and is provided with a pair of top and bottom electrodes 7T and 7B on its major surfaces. The driving portion 22 is provided with a side electrode 5 on a side surface perpendicular to the width direction. Other electrodes 50T and 50B are also provided so as to be parallel to the electrodes 7T and 7B. The power generating portion 31 is polarized in the width direction and the thickness direction of the piezoelectric body and the driving portion 22 is polarized in the width direction of the piezoelectric body 1. By regulating width of the piezoelectrically inactive region 11 provided between the electrode 50T (50B) of the driving portion 22 and the electrode 7T (7B) of the power generating portion 31, the transforming ratio can be regulated.

17 Claims, 6 Drawing Sheets

PIEZOELECTRIC TRANSFORMER HAVING FOUR-TERMINAL STRUCTURE

BACKGROUND OF THE INVENTION

The present invention relates to a piezoelectric transformer and, particularly, to a piezoelectric transformer including a rectangular piezoelectric body and voltage input electrodes and voltage output electrodes formed on major surfaces of the piezoelectric body.

An electromagnetic type transformer has been used as a step-down transformer of an AC adapter for supplying electric power from a commercial power source to a battery-driven electronic device.

On the other hand, U.S. Pat. No. 2,830,274 issued to R. A. Rosen in 1958 discloses a piezoelectric transformer which operates on a principle which is totally different from that of a conventional electromagnetic type transformer. In the field of the piezoelectric transformer, there are various other proposals after Rosen. For example, Japanese Unexamined Patent Publication (Kokai) Nos. S61-54685, S61-54686 and S61-152165 propose some of them. All of the piezoelectric transformers disclosed in the U.S. Patent and these Kokais are step-up piezoelectric transformers.

The step-up piezoelectric transformer will be described with reference to FIG. 1 which corresponds to the Rosen type piezoelectric transformer disclosed in the above U.S. Patent. FIG. 1 is a perspective view of the Rosen type piezoelectric transformer showing its structure which is being driven in the $\lambda/2$ mode. The piezoelectric transformer comprises a rectangular piezoelectric body 1. The piezoelectric body 1 is sectioned by a plane perpendicular to a longitudinal direction in parallel to an axis L of three-dimensional coordinates axes indicated in FIG. 1 to a driving portion 20 and a power generating portion 30. A top electrode 6T and a bottom electrode 6B are formed on a top and bottom major surfaces of the driving portion 20 and connected to input terminals 2B and 2A, respectively. The bottom electrode 6B is further connected to an output terminal 3A. On the other hand, an end electrode 4 is formed on an end surface of the power generating portion 30, which is perpendicular to the longitudinal direction L, and connected to an output terminal 3B. The driving portion 20 of the piezoelectric body 1 is polarized in a thickness direction as shown by an arrow P pointing upwardly along an axis t and the power generating portion 30 is polarized in the longitudinal direction L as shown by an arrow P pointing rightwardly.

When this piezoelectric transformer is to be operated, an AC voltage $e_{in}$ having a frequency equal to that of the longitudinal resonant mechanical vibration of the piezoelectric body 1 is applied between the input terminals 2A and 2B connected to the electrodes 6B and 6T of the driving portion 20, As a result, the driving portion 20 is deformed repeatedly in the longitudinal direction on the basis of the piezoelectric lateral effect and, thus, the piezoelectric body 1 is caused to resonantly vibrate. In the power generating portion 30, a voltage is generated between the bottom electrode 6B of the driving portion 20 and the end electrode 4 of the power generating portion 30 due to the piezoelectric longitudinal effect caused by the longitudinal vibration of the piezoelectric body, which is derived between the output terminals 3A and 3B as a step-up output voltage having a frequency equal to that of the input AC voltage $e_{in}$. This transformer is mechanically fixed to a support structure (not shown) through a support member 8 fixedly provided on a resonance node of the longitudinal vibration of the piezoelectric body 1, which is, in this case, a center of the piezoelectric body 1 in the direction L, that is, a border between the driving portion 20 and the power generating portion 30.

This step-up piezoelectric transformer may be modified to a step-down type transformer by using the primary side and the secondary side inversely, that is, by applying the input AC voltage between the output terminals 3A and 3B and deriving an output voltage between the input terminals 2A and 2B. However, since, in the case of the step-up type transformer, it is usual to use a high transformation ratio so that a high output voltage can be obtained with a low input voltage, it is difficult to obtain an appropriate step-down voltage from a commercial power source by merely inverting the primary and secondary sides. In order to solve this problem, a piezoelectric transformer having a structure suitable for a step-down transformer has been proposed.

An example of the step-down piezoelectric transformer will be described with reference to FIG. 2 which is a perspective view of a step-down piezoelectric transformer disclosed in Japanese Unexamined Patent Publication (Kokai) No. H6-177451 of the same assignee as the assignee of this application. In FIG. 2, a rectangular piezoelectric body 1 is sectioned by a plane perpendicular to a width direction along an axis W of three-dimensional coordinates axes indicated in FIG. 2 to a driving portion 21 and a power generating portion 31. A top electrode 7T and a bottom electrode 7B are formed on a top and bottom major surfaces of the power generating portion 31 and connected to output terminals 3A and 3B, respectively. The output terminal 3A is also connected to an input terminal 2A. On the other hand, a side electrode 5 is formed on a side surface of the driving portion 21, which is perpendicular to the width direction, and connected to an input terminal 2B. The power generating portion 31 of the piezoelectric body 1 is polarized on a thickness direction as shown by an arrow P pointing upwardly and the driving portion 21 is polarized in the width direction as shown by a arrow P pointing to the power generating portion 31.

When this piezoelectric transformer is to be operated, an AC voltage $e_{in}$ having a frequency equal to that of the longitudinal resonant mechanical vibration of the piezoelectric body 1 is applied between the input terminal 2B connected to the side electrode 5 and the input terminal 2A connected to the electrode 7T (or 7B) of the power generating portion 31. As a result, the driving portion 21 is deformed repeatedly in the longitudinal direction on the basis of the piezoelectric lateral effect and, thus, the piezoelectric body 1 is caused to resonantly vibrate. In the power generating portion 31, a voltage is generated between the top and bottom electrodes 7T and 7B due to the piezoelectric lateral effect caused by the longitudinal vibration of the piezoelectric element, which is derived between the output terminals 3A and 3B as a step-down output voltage having a frequency equal to that of the input AC voltage $e_{in}$. This transformer is mechanically fixed to a support structure (not shown) through a support member 8 provided on a resonance node of the longitudinal vibration of the piezoelectric element, which is, in this case, a center of the piezoelectric body 1 in the direction L.

However, since the step-down piezoelectric transformer mentioned above has a 3-terminal structure in which the input portion is partially used commonly with the output portion, a primary side is not electrically separated from a secondary side. When a piezoelectric transformer is used as a power source, it is practically very important to separate the primary side from the secondary side. Particularly, when the conventional electromagnetic type coil transformer which has an electrically separated input/output structure is to be replaced by the piezoelectric transformer, the electrical separation between the primary side and the secondary side is an indispensable requirement.

Further, since, in the conventional piezoelectric transformer, when the size of the primary or secondary side is determined, the impedance of the primary or the secondary side is necessarily determined, the freedom of design is small.

SUMMARY OF THE INVENTION

An object of the present invention is to provide a 4-terminal piezoelectric transformer having a structure in which an input side is electrically separated from an output side.

Another object of the present invention is to provide a piezoelectric transformer capable of changing an impedance of one of a primary side and secondary side while maintaining an impedance of the other side constant, capable of regulating a ratio of transformation and of providing high freedom of design.

In order to achieve the above objects, a piezoelectric transformer according to the present invention is featured by providing a non-polarized region between a driving portion and a power generating portion of a rectangular piezoelectric body so that a ratio of transformation can be regulated by changing an input impedance thereof by regulating a width of the piezoelectrically inactive region.

The piezoelectric transformer of the present invention which comprises a rectangular plate type piezoelectric body having voltage input electrodes and voltage output electrodes formed on major surfaces thereof is featured in structure by that:

(1) the rectangular piezoelectric body is sectioned by a plane perpendicular to a width direction thereof to a power generating portion and a driving portion, (2) a pair of electrodes are provided on the driving portion as voltage input electrodes and a pair of electrodes are provided on the power generating portion as voltage output electrodes, (3) the voltage output electrodes are provided on a top and bottom surfaces of the power generating portion, respectively, and one of the voltage input electrodes is provided on a side surface of the driving portion, which is perpendicular to the width direction thereof, and the other is provided on at least one of the top and bottom surfaces of the power generating portion in parallel to the voltage output electrode on the same surface with a constant gap such that the other voltage input electrode is electrically separated from the voltage output electrode provided on the same surface, and (4) the power generating portion is polarized in a thickness direction of the piezoelectric body and the driving portion is polarized in the width direction of the piezoelectric body.

In another aspect, the piezoelectric transformer according to the present invention is featured by that:

(1) the rectangular piezoelectric body is sectioned by planes perpendicular to a width direction thereof to a first, second and third regions arranged along the longitudinal direction of the piezoelectric element, one of the first and third regions being used as a driving portion and the other region being used as a power generating portion, (2) a pair of electrodes are provided on the driving portion as voltage input electrodes and a pair of electrodes are provided on the power generating portion as voltage output electrodes, (3) the driving portion is polarized in a width direction of the piezoelectric body and the power generating portion is polarized in the longitudinal direction of the piezoelectric body, and (4) a piezoelectrically inactive portion is provided between the driving region and the power generating portion, a step-down ratio being regulatable by regulating a volume of the piezoelectrically inactive portion of the driving portion.

BRIEF DESCRIPTION OF THE DRAWINGS

The above and other features and advantages of the present invention will becomes more clearly appreciated from the following description taken in conjunction with the accompanying drawings in which like portions are denoted by like reference numerals and in which.

DETAILED DESCRIPTION OF THE PREFERRED EMBODIMENTS

Preferred embodiments of the present invention will be described with reference to the accompanying drawings.

First, points which are commonly used in the embodiments to be described will be described briefly.

(1) Plate Element for Piezoelectric Transformer

As a piezoelectric ceramics having small electromechanical coupling coefficient $k_{31}$ and large electromechanical coupling coefficient $k_{33}$, a sintered body of a material of PZT group, which is commercially available from K. K. Tokin under tradename of NEPEC8, was used. The sintered body was cut to suitably to form rectangular piezoelectric plates which are to be used in the embodiments as piezoelectric bodies.

(2) Formation of Electrodes

Electrodes are formed on the piezoelectric body by using an electrically conductive paste containing silverpalladium alloy containing 73% of silver and 27% of palladium by way of usual thick film screen printing techniques. Following this, the patterned electrodes are subjected to sintering at a temperature of 750° C.

(3) Polarization

A driving portion and a power generating portion of the piezoelectric body on which the electrodes are formed are immersed in an insulating oil pre-heated to a temperature of 150° C. Subsequently, DC electric field strength of 1.0–2.0 kV/mm is applied to the immersed element for 15 minutes.

(4) Support Member Mounting

A support member having a width of 0.3 mm was formed by punching a copper plate 0.1 mm thick. The support member is arranged on a voltage output electrode of the power generating portion and extends in a width direction of the piezoelectric body by a length corresponding to a width of the voltage output electrode. The copper support member is fixed by electrically conductive adhesive to a position of the piezoelectric element corresponding to a node of longitudinal vibration of the transformer.

(5) Mounting of Electrode Terminals

A copper plate 0.1 mm thick is punched to a 0.3 mm×0.3 mm square pieces and the square piece was point-welded to a center of a position corresponding to a vibration node on a top surface of the driving portion.

[First Embodiments]

Figure 1:
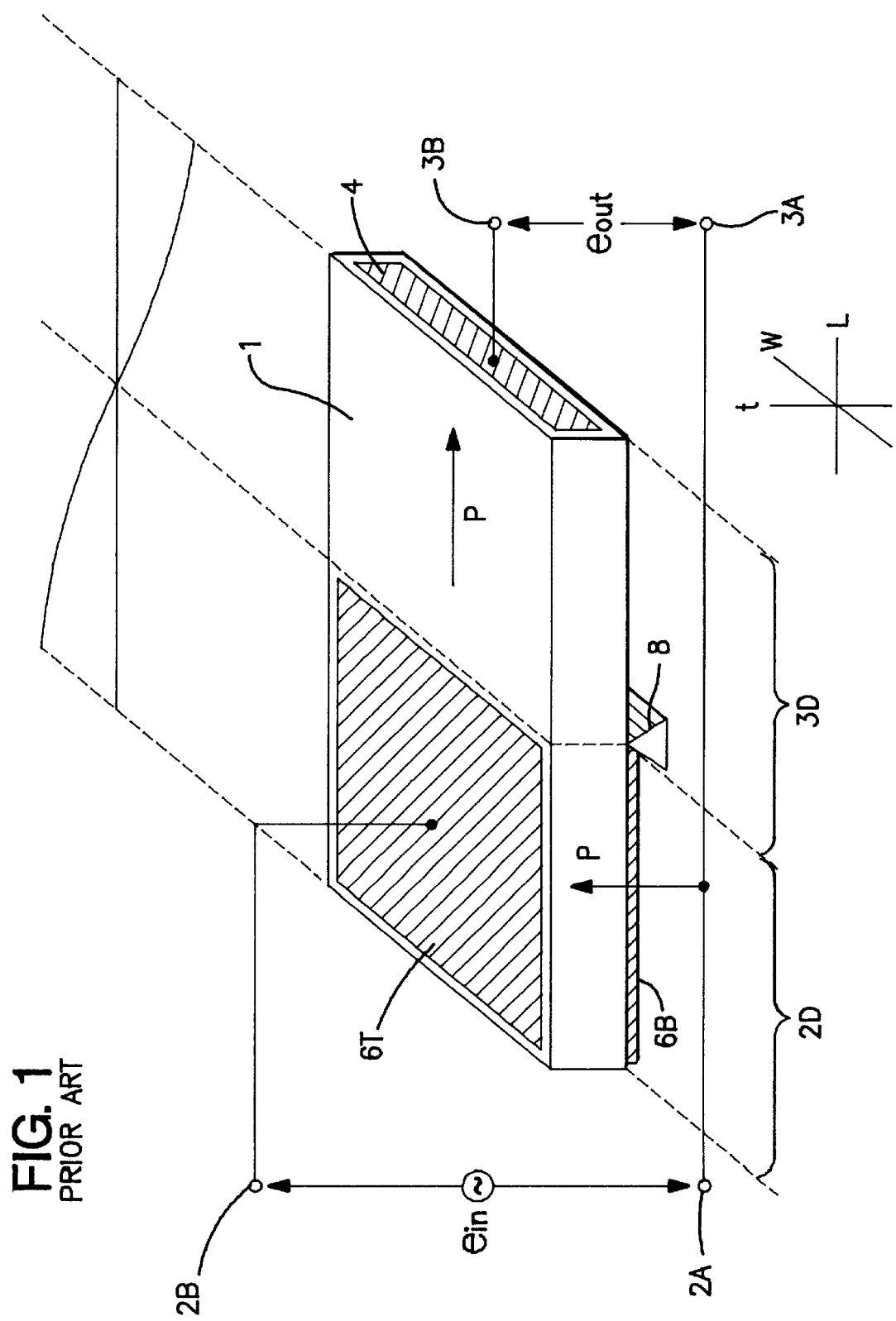
FIG. 1 is a perspective view of an example of a conventional step-up piezoelectric transformer and FIG. 2 is a perspective view of an example of a conventional step-down piezoelectric transformer.
Figure 2:
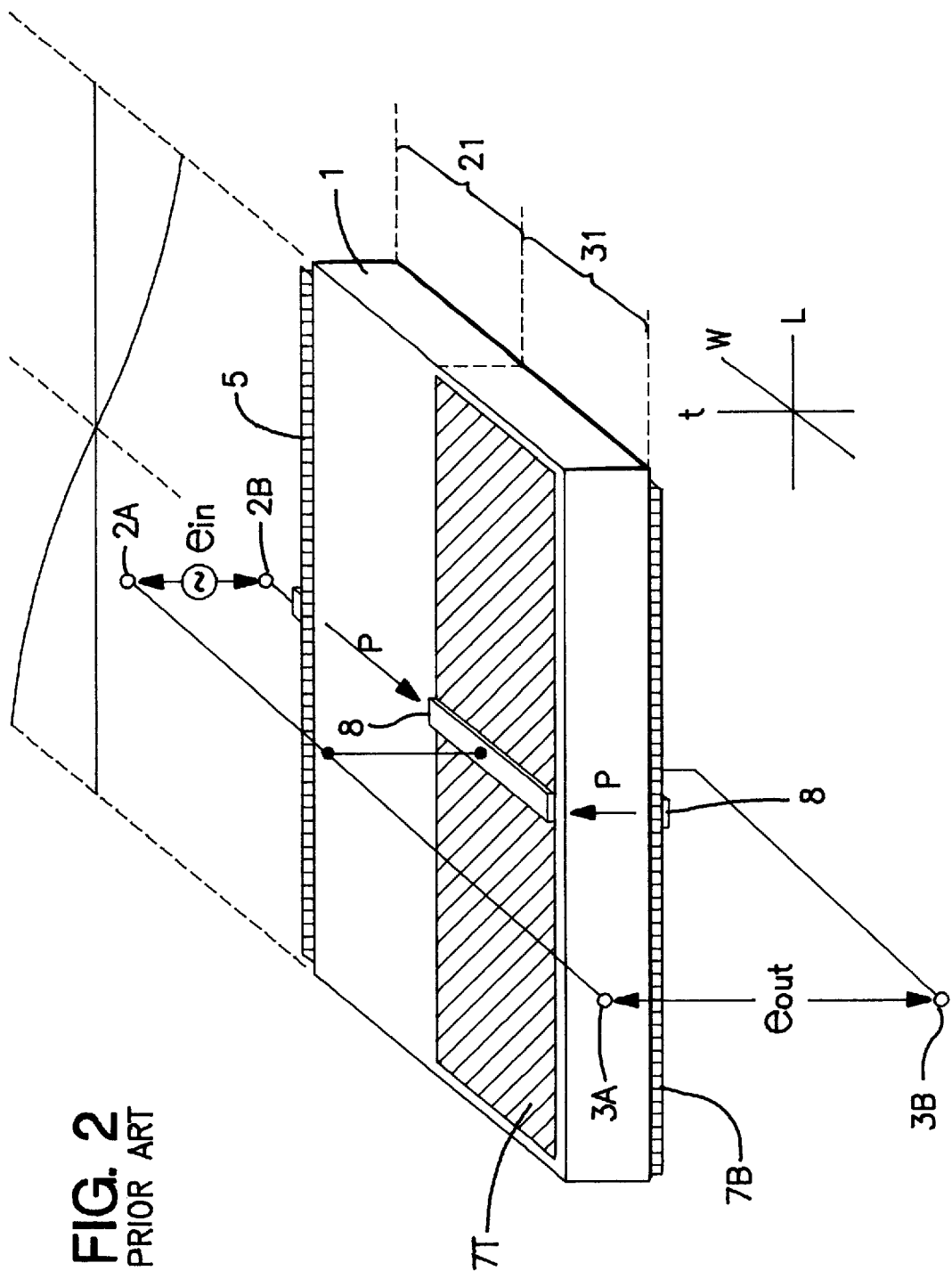
Figure 3:
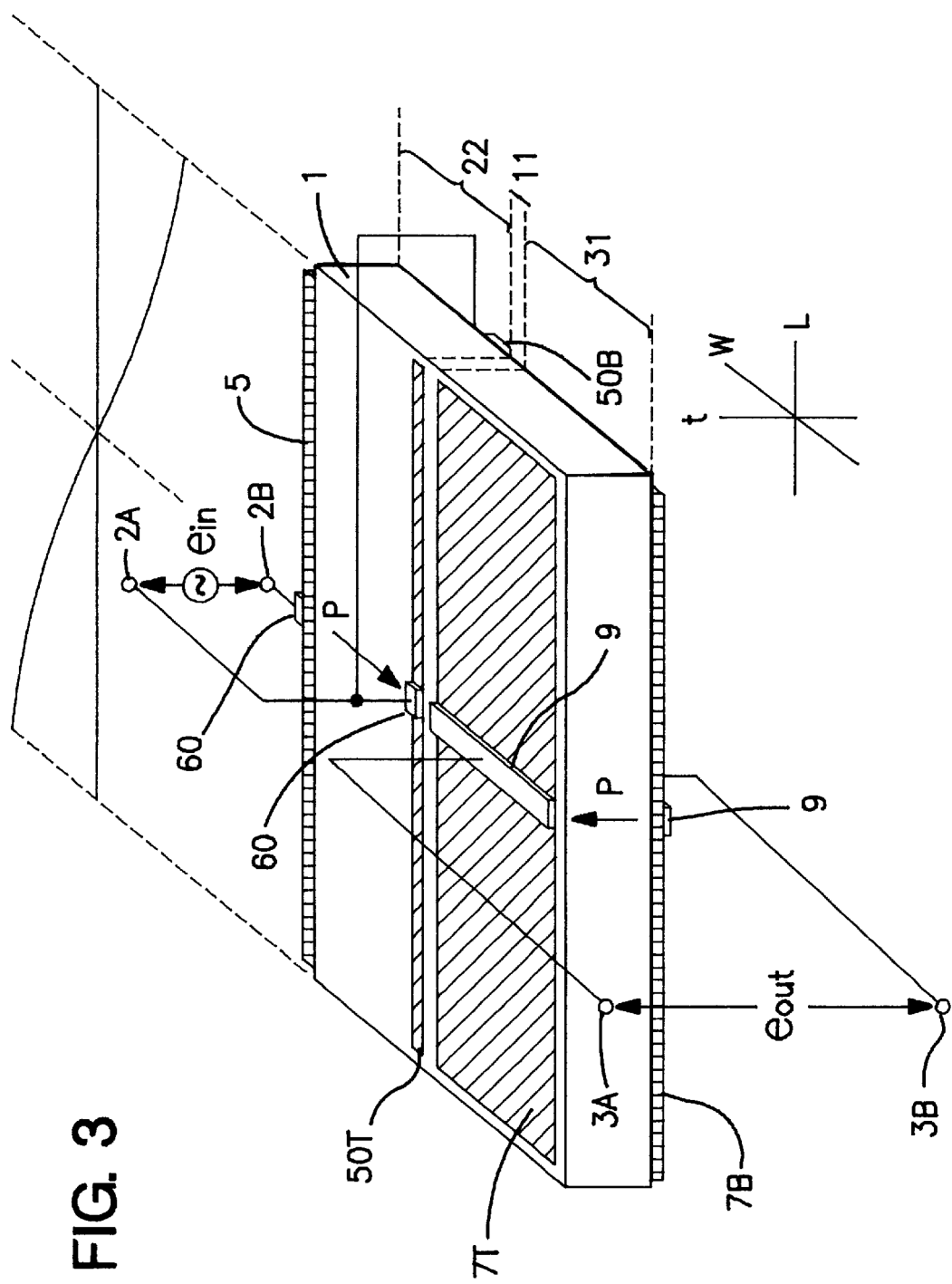
FIG. 3 is a perspective view of a piezoelectric transformer according to a first embodiment of the present invention.

FIG. 3 is a perspective view showing a piezoelectric transformer according to a first embodiment of the present invention, which is a λ/2 mode piezoelectric transformer. In FIG. 3, a reference numeral 1 denotes a piezoelectric body in the form of rectangular plate, 22 a driving portion and 31 a power generating portion. A reference numeral 5 denotes a side electrode of the driving portion 22, 50T a top strip electrode of the driving portion 22 and 50B a bottom strip electrode of the driving portion 22. A reference numeral 60 denotes electrode terminals provided on the driving portion 22 which are connected to voltage input terminals 2A and 2B, respectively, and on the power generating portion 31 which are connected to voltage output terminals 3A and 3B, respectively, and 9 terminal support members arranged on respective voltage output electrodes 7T and 7B. Referring to FIG. 3, an upward arrow P extending in a thickness direction of the piezoelectric element, which corresponds to an axis t of the three dimensional coordinates axes t, L and W and an arrow P extending in a width direction corresponding to the axis W on the top surface of the driving portion 22 graphically indicate directions of residual polarization. That is, the driving portion 22 of this piezoelectric transformer is polarized in the width direction W thereof toward the power generating portion 31 and the power generating portion 31 is polarized upward in the thickness direction t.

The piezoelectric body 1 is 42 mm long, 10 mm wide and 0.4 mm thick. On an upper and lower major surfaces of the power generating portion 31, a top electrode 7T and a bottom electrode 7B each of which has a rectangular shape having a width which is a half of the width W of the piezoelectric body 1 and extends longitudinally of the piezoelectric body in the direction L are formed. On the other hand, a side electrode 5 is formed on a whole side surface of the driving portion 22, which is perpendicular to the width direction thereof. Further, in regions of the top and bottom major surfaces of the driving portion 22 near the power generating portion 31, an top strip electrode 50T and a bottom strip electrode 50B each 0.8 mm wide are formed, respectively, with a distance of 1 mm from the respective upper and lower electrodes 7T and 7B on the power generating portion 31. Thereafter, electrode terminals 60 are welded to positions of the top strip electrode 50T and the side electrode 5 of the driving portion 22. The portions to which the electrode terminals 60 are welded correspond to a longitudinal vibration node of the piezoelectric body 1 and, in this case, the node is a center of the piezoelectric body 1 having the length of L, and terminal/support members 9 are mounted on the node of piezoelectric body 1. The driving portion 22 and the power generating portion 31 of the piezoelectric body 1 in this state are polarized as shown by the arrows, resulting in a not polarized, piezoelectrically inactive region 11 between the driving portion 22 and the power generating portion 31.

Driving efficiency, maximum output and transformation ratio of the piezoelectric transformer according to this embodiment are obtained by applying a sinusoidal AC voltage of 100V between the input terminals 2A and 2B of the piezoelectric transformer and detecting an output voltage between the output terminals 3A and 3B thereof. It has been found that efficiency of 93%, maximum output of 16 watts and transforming ratio of 0.1 are obtained at resonance frequency of 37 kHz.

[Embodiment 2]

Figure 4:
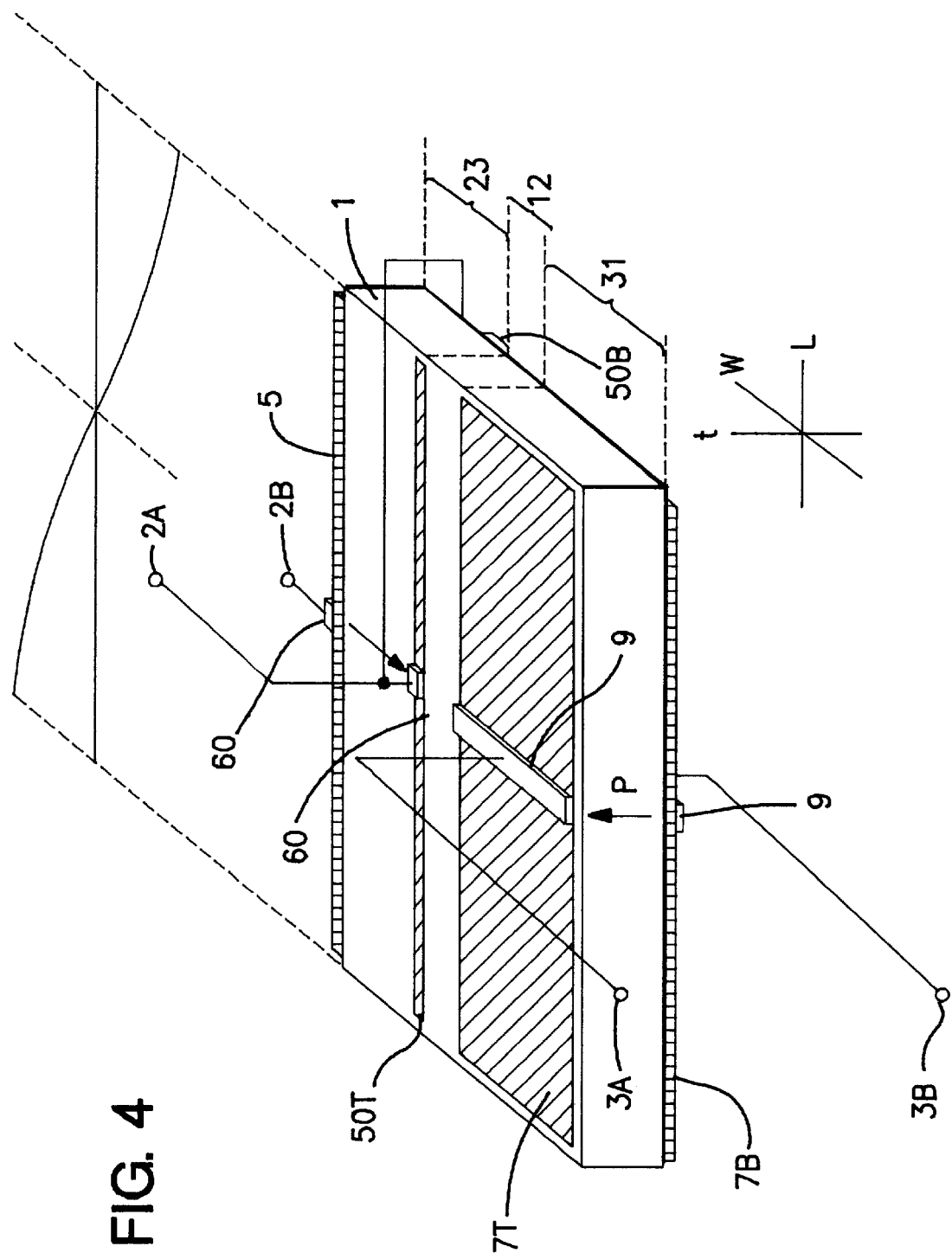
FIG. 4 is a perspective view of a piezoelectric transformer according to a second embodiment of the present invention.

FIG. 4 is a perspective view showing a second embodiment of the present invention. The second embodiment differs from the first embodiment in that the distance of the top and bottom strip electrodes 50T and 50B from the respective electrodes 7T and 7B of the power generating portion 31 is 3 mm and in that a piezoelectrically inactive region 12 is provided between the strip electrode 50T (50B) of the driving portion 23 and the electrode 7T (6B) of the power generating portion 31 by not polarizing the region.

Driving efficiency, maximum output and transforming ratio of the piezoelectric transformer according to this embodiment are obtained by applying a sinusoidal AC voltage of 100V to the input portion of the piezoelectric transformer and detecting the output voltage thereof. It has been found that efficiency of 89%, maximum output of 16 watts and transforming ratio of 0.2 are obtained at resonance frequency of 37 kHz.

Since the efficiency is lowered by the use of wider inactive region, it is preferable in view of efficiency that the distance between the electrode of the power generating portion and the strip electrode is 4 mm or less. In view of transforming ratio, the distance is preferably 0.5 mm or more.

[Embodiment 3]

Figure 5:
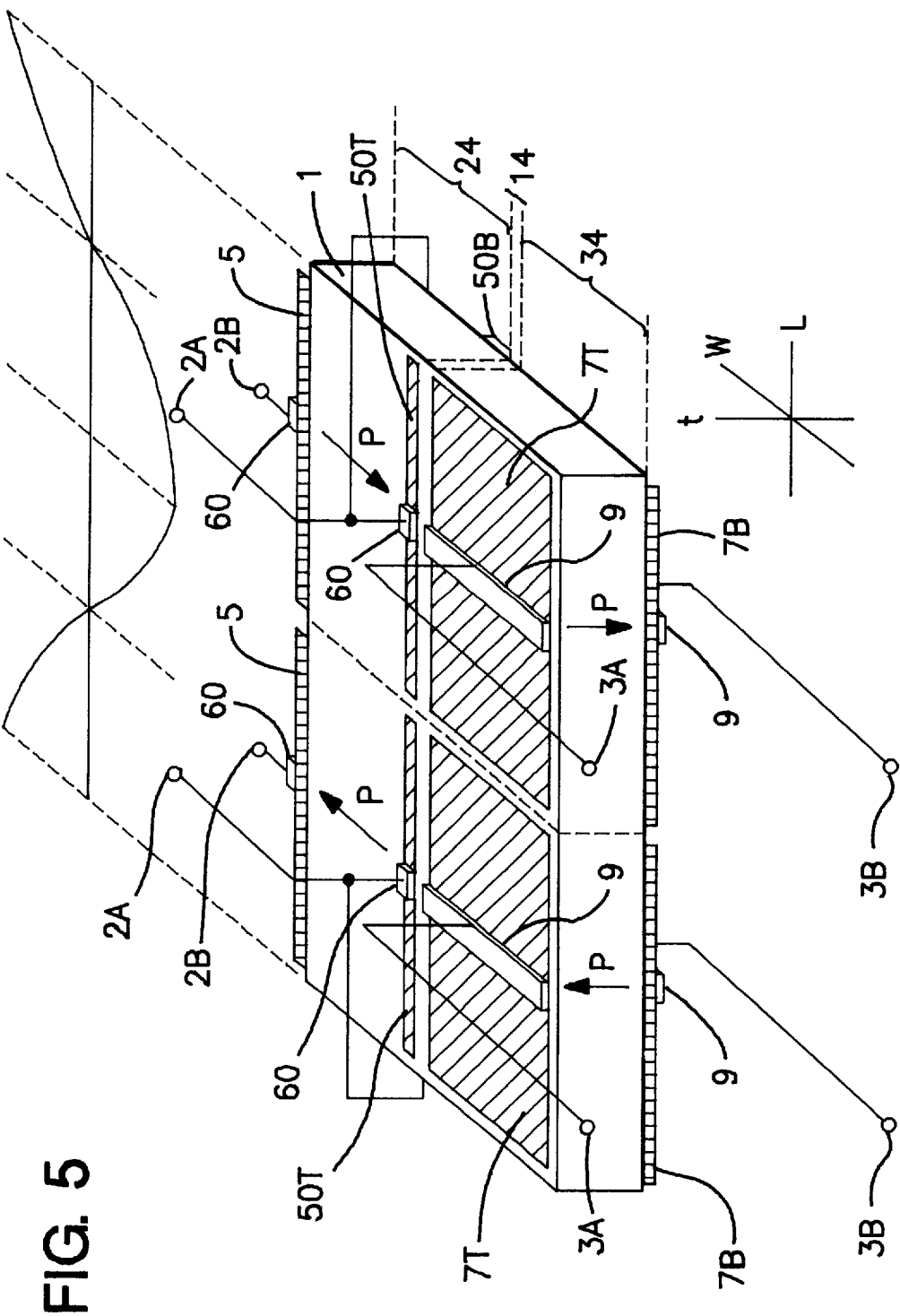
FIG. 5 is a perspective view of a piezoelectric transformer according to a third embodiment of the present invention.

FIG. 5 is a perspective view showing a piezoelectric transformer according to a third embodiment of the present invention. As shown in FIG. 5, the operating mode of the piezoelectric transformer of the third embodiment is twice of λ/2. The structure of the transformer shown in FIG. 5 is equivalent to a pair of the piezoelectric transformers, each of the first embodiment having length of λ/2, connected in the longitudinal direction.

Referring to FIG. 5, in a power generating portion 34, there are two arrows extending oppositely in a thickness direction of the piezoelectric body and, in a driving portion 24, there are two arrows extending oppositely in a width direction of the piezoelectric body. These arrows indicate graphically directions of residual polarization. That is, the driving portion 24 of this piezoelectric transformer is polarized in the width direction oppositely and the power generating portion 34 is polarized in the thickness direction oppositely.

The piezoelectric body 1 is 42 mm long, 10 mm wide and 0.4 mm thick. On a top and bottom major surfaces of the power generating portion 34, rectangular top electrodes 7T and rectangular bottom electrodes 7B were formed. The top electrodes 7T extend longitudinally of the piezoelectric body 1 in the direction L with a gap of 1 mm between them. Similarly, the rectangular bottom electrodes 7B extend longitudinally of the piezoelectric body in the direction L with a gap of 1 mm therebetween. The electrode 7T as well as 7B has a width which is a half of the width W of the piezoelectric element 1. On the other hand, a side electrode 5 is formed on a whole side surface of each driving portion 24, which is perpendicular to the width direction thereof. Further, on the top and bottom surfaces of each driving portion 24 on the side of the driven portion 34, an top strip electrode 50T and a bottom strip electrode 50B each 0.8 mm wide are formed, respectively, with a distance of 1 mm from the respective top and bottom electrodes 7T and 7B on the power generating portion 34. The top strip electrodes 50T are arranged with a gap of 1 mm therebetween and, similarly, the bottom strip electrodes 50B are arranged with a gap of 1 mm therebetween. Thereafter, electrode terminals 60 are welded to centers of the respective top and bottom rectangular electrodes 7T and 7B of each power generating portion 34, to centers of the respective top and bottom strip electrodes 50T and 50B of each driving portion 24 and to a center of the side electrode 5 of each driving portion 24. The centers correspond to longitudinal vibration nodes of the piezoelectric body 1, which, in this embodiment, positions of the piezoelectric body 1 inside from opposite ends thereof by one fourth of the length L of the piezoelectric body. Further, terminal/support members 9 extending in the width direction of the piezoelectric element 1 are mounted on the centers of the top and bottom rectangular electrodes 7T and 7B. The driving portions 24 and the power generating portions 34 of the piezoelectric body 1 in this state are polarized, resulting in a piezoelectrically inactive region 14 between the driving portions 24 and the power generating portions 34.

Driving efficiency, maximum output and transforming ratio of the piezoelectric transformer according to this embodiment are obtained by applying a sinusoidal AC voltage of 100V to an input portion of the piezoelectric transformer and detecting an output voltage thereof. It has been found that efficiency of 93%, maximum output of 32 watts and transforming ratio of 0.1 are obtained at resonance frequency of 74 kHz.

[Embodiment 4]

Figure 6:
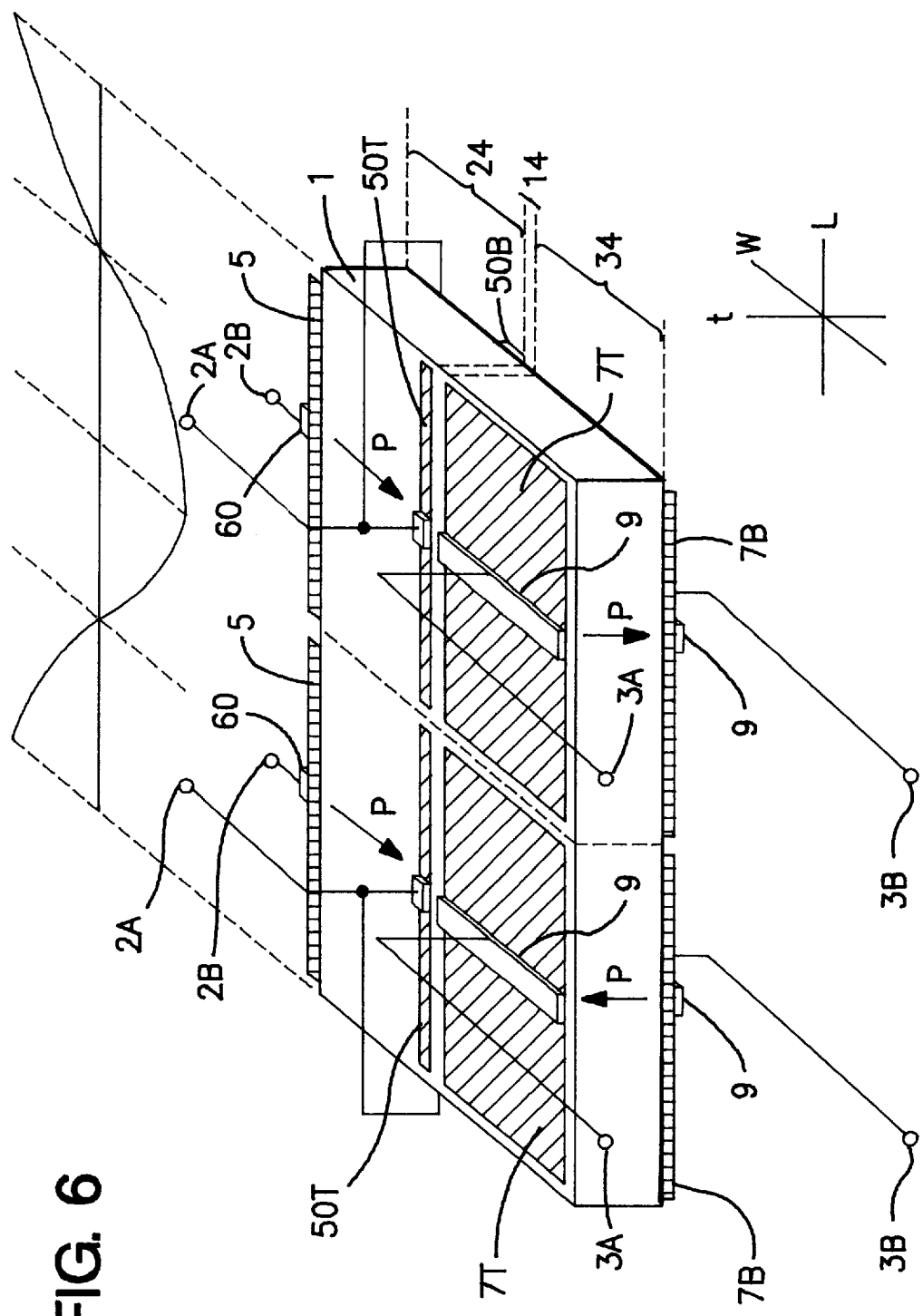
FIG. 6 is a perspective view of a piezoelectric transformer according to a fourth embodiment of the present invention.

FIG. 6 is a perspective view showing a fourth embodiment of the present invention. The fourth embodiment differs from the third embodiment in that driving portions 25 are polarized in the same direction toward power generating portions 24. Since other constructive conditions of the fourth embodiment are the same as those in the third embodiment, a detailed description of the fourth embodiment is omitted.

Driving efficiency, maximum output and transforming ratio of the piezoelectric transformer according to this embodiment are obtained by applying sinusoidal AC voltages of 100V and having phases different from each other by 180° degrees to input portions of the piezoelectric transformer and detecting an output voltage thereof. It has been found that efficiency of 93%, maximum output of 32 watts and transforming ratio of 0.1 are obtained at resonance frequency of 74 kHz.

The piezoelectric transformer according to each of the first to fourth embodiments described above is a combination of the following constructive features: (1) the rectangular piezoelectric body, (2) the lateral effect drive, (3) the lateral effect power generation, (4) the electrically separated input/output structure, (5) the regulation of input side electric capacity, (6) in-phase or opposite phase input to the driving portions, (7) the change of polarizing direction of the driving portions, (8) the utilization of high order vibration mode and (9) the arrangement of the electrode terminals which function as the support members at vibration nodes of the driving portion and the power generating portions. With the combination, the input side and the output side of the present piezoelectric transformer are separated electrically unlike the conventional piezoelectric transformer and thus the present piezoelectric transformer is suitable to apply a piezoelectric transformer to a power source.

Further, since the electrical separation between the input side and the output side of the piezoelectric transformer is achieved by using the piezoelectrically inactive region therebetween, it becomes possible to regulate the input impedance to thereby easily change the transforming ratio.

Since the present invention utilizes a 4-terminal structure in which the input side is electrically separated from the output side by providing the strip electrodes which constitute, together with the conventional side face electrode, a set of voltage input electrodes, it is easy to replace the conventional electromagnetic transformer by the piezoelectric transformer.

Further, since, in the present invention, the regulation of physical volume of the piezoelectric active portion of the driving portion is possible by regulating the positions of the electrodes used for separating the input side from the output side in the width direction, it is possible to individually and independently set the input/output impedances regardless of the external size of the piezoelectric transformer.

What is claimed is:

1. A piezoelectric transformer comprising:
   an elongated rectangular piezoelectric body having a pair of major surfaces and elongated in a longitudinal direction;
   a pair of first electrodes formed on said major surfaces to sandwich said piezoelectric body and extending in said longitudinal direction;
   said body sandwiched between said first electrodes being polarized in a thickness direction thereof;
   a pair of second electrodes formed on said major surfaces to sandwich said piezoelectric body and extending in said longitudinal direction;
   a piezoelectrically inactive region provided between said first electrodes and said second electrodes so as to be elongated in said longitudinal direction; a third electrode formed on a longitudinal side surface of said piezoelectric body closer to said second electrodes and elongated in said longitudinal direction; and
   said body, between said third electrode and said second electrodes, being polarized in a direction perpendicular to the length of said inactive region.

2. A piezoelectric transformer claimed in claim 1, wherein a region of said piezoelectric body on which said second electrodes and said third electrode are formed is utilized as a driving portion and a region of said piezoelectric body on which said first electrodes are formed is utilized as a power generating portion.

3. A piezoelectric transformer claimed in claim 2, further comprising a first terminal electrically connected to said second electrodes, a second terminal electrically connected to said third electrode, a third terminal electrically connected to one of said first electrodes and a fourth terminal electrically connected to the other of said first electrodes, and thereby constituting a four-terminal structure in which said driving portion is electrically separated from said power generating portion.

4. A piezoelectric transformer claimed in claim 1, wherein each of said first electrodes, said second electrodes and said third electrode is divided into two electrode pieces.

5. A piezoelectric transformer claimed in claim 2, wherein said driving portion of said piezoelectric body is polarized in a width direction and said power generating portion of said piezoelectric body is polarized in a thickness direction.

6. A piezoelectric transformer claimed in claim 4, wherein said regions sandwiched by said divided first electrode pieces are polarized in opposite directions.

7. A piezoelectric transformer claimed in claim 4, wherein said divided electrode pieces are connected to different external terminals and opposed ones of said second electrodes are electrically connected to each other.

8. A piezoelectric transformer claimed in claim 1, wherein a width of said second electrode is smaller than that of said first electrode.

9. A piezoelectric transformer comprising:
   a piezoelectric plate in a form of an elongated plate elongating in a lengthwise direction thereof;
   said piezoelectric plate having at least one driver section and a generator section, both of said driver section and said generator section being elongated in said lengthwise direction;
   said piezoelectric plate having an inactive section between said driver section and said generator section and elongated in said lengthwise direction;
   said driver section being polarized in a widthwise direction of said piezoelectric plate;
   said generator section being polarized in a thickness direction of said piezoelectric plate;
   a pair of input terminals connected to electrodes associated with said driver section;
   a pair of output terminals connected to electrodes associated with said generator section;
   said output terminals being electrically isolated from said input terminals, so that a step-down output voltage having a frequency equal to that of an input AC voltage applied to said input terminals is produced.

10. A piezoelectric transformer according to claim 9, wherein said inactive section is a non-polarized region.

11. The piezoelectric transformer of claim 10, wherein a transformation ratio is regulated by a width of said inactive section.

12. A piezoelectric transformer according to claim 9, wherein said driver section and said generator section are divided into two sections, respectively, so as to be juxtaposed in said lengthwise direction.

13. A piezoelectric transformer according to claim 12, wherein said divided sections are polarized in opposite directions.

14. A piezoelectric transformer comprising:
   an elongated piezoelectric plate having top and bottom surfaces and a first and second opposed side surfaces elongated in a longitudinal direction thereof,
   first top and bottom electrodes provided on said top and bottom surfaces, respectively, so as to be opposed to each other and elongated in said longitudinal direction,
   said plate between said first top and bottom electrodes being polarized in a thickness direction thereof to provide a generator section close to said first side surfaces,
   second top and bottom electrodes provided on said top and bottom surfaces, respectively, so as to be opposed to each other and to be opposed to said first top and bottom electrodes, respectively,
   said second top and bottom electrodes being spaced apart from said first top and bottom electrodes so as to provide a piezoelectrically inactive region therebetween,
   a side electrode provided on said second side surface and elongated in said longitudinal direction,
   said plate, between said side electrode and said second top and bottom electrodes, being polarized in a direction perpendicular to the length of said inactive region to provide a driver section,
   a pair of output terminals electrically connected to said first top and bottom electrodes, and
   a pair of input terminals electrically connected to said side electrode and said second top and bottom electrodes.

15. A piezoelectric transformer according to claim 14, wherein each of said first top and bottom electrodes and said second top and bottom electrodes has a length substantially that of said plate in said longitudinal direction.

16. A piezoelectric transformer according to claim 14, wherein a width of said second top and bottom electrodes is smaller than that of said first top and bottom electrodes.

17. A piezoelectric transformer according to claim 14, wherein all of said first top and bottom electrodes, said second top and bottom electrodes and said side electrode are divided into two sections, respectively, and electrically connected to additional terminals, respectively.

* * * * *